(12) United States Patent
Li et al.

(10) Patent No.: US 8,030,719 B2
(45) Date of Patent: Oct. 4, 2011

(54) THERMAL SENSING AND RESET PROTECTION FOR AN INTEGRATED CIRCUIT CHIP

(75) Inventors: Xiaoming Li, Irvine, CA (US); Mishel Matioubian, Irvine, CA (US); Surinderjit Dhaliwal, Laguna Niguel, CA (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 217 days.

(21) Appl. No.: 12/387,892

(22) Filed: May 8, 2009

(65) Prior Publication Data
US 2009/0289321 A1   Nov. 26, 2009

Related U.S. Application Data

(60) Provisional application No. 61/128,352, filed on May 21, 2008.

(51) Int. Cl.
*H01L 29/82* (2006.01)

(52) U.S. Cl. .............. 257/425; 257/428; 257/E31.131

(58) Field of Classification Search .............. 257/424, 257/425, 428–430, 467, 470, 478, E31.131
See application file for complete search history.

(56) References Cited

U.S. PATENT DOCUMENTS

| | | |
|---|---|---|
| 6,330,668 B1 | 12/2001 | Curiger |
| 6,786,639 B2 | 9/2004 | Glenford |
| 7,465,610 B2 * | 12/2008 | Nadd et al. ............ 438/142 |

* cited by examiner

*Primary Examiner* — Hoai V Pham
(74) *Attorney, Agent, or Firm* — Farjami & Farjami LLP

(57) ABSTRACT

There is provided a semiconductor package that includes a first semiconductor die mounted on a package substrate. The semiconductor package further includes a second semiconductor die mounted on the first semiconductor die and including a thermal sensing and reset protection circuit. The thermal sensing and reset protection circuit is configured to determine a temperature of the first semiconductor die and to provide a reset protection signal to the first semiconductor die when the temperature of the first semiconductor die is substantially equal to a preset temperature so as to protect the first semiconductor die from thermal runaway. The reset protection signal can cause the first semiconductor die to be in a sleep mode or a reset state.

16 Claims, 3 Drawing Sheets

THERMAL SENSING AND RESET PROTECTION FOR AN INTEGRATED CIRCUIT CHIP

RELATED APPLICATIONS

This application claims priority from U.S. Provisional Application No. 61/128,352, filed May 21, 2008, which is hereby incorporated by reference in its entirety.

BACKGROUND OF THE INVENTION

1. Field of the Invention

The present invention relates generally to thermal protection circuits and, more specifically to thermal protection circuits for semiconductor dies.

2. Background Art

A System-On-Chip (SOC) typically includes an integrated electronic system on a single integrated circuit (IC) chip. As transistor size continues to shrink in submicron SOCs, transistor leakage power can correspondingly increase. Since transistor leakage power is a function of temperature, as the temperature of the SOC increases, the leakage power can also increase. When heat generated as a result of the leakage power and the active power from the SOC exceeds the heat dissipation capacity of the SOC package, chip temperature can rise at a faster rate with increasing leakage power, thereby resulting in a process called "thermal runaway." Since a thermal runaway can destroy the SOC by causing it to burn up, it is very important to prevent the thermal runaway from occurring.

In a conventional approach for preventing a thermal runaway from occurring, a thermal diode can be built into the SOC. A separate thermal sensor chip residing on the circuit board that houses the SOC can then read the temperature of the SOC from the on-chip thermal diode and generate over temperature alarm and control signals to shut down the power supply to the SOC or put the SOC in a low power mode so as to prevent thermal runaway. In this conventional approach, however, thermal diode offset and noise from the SOC can undesirably limit the accuracy of the temperature measurement. Accordingly, there is a need in the art for providing effective thermal runaway protection for an IC chip, such as an SOC.

SUMMARY OF THE INVENTION

There is provided thermal sensing and reset protection for an IC chip, substantially as shown in and/or described in connection with at least one of the figures, as set forth more completely in the claims.

BRIEF DESCRIPTION OF THE DRAWINGS

The features and advantages of the present invention will become more readily apparent to those ordinarily skilled in the art after reviewing the following detailed description and accompanying drawings, wherein.

DETAILED DESCRIPTION OF THE INVENTION

Although the invention is described with respect to specific embodiments, the principles of the invention can obviously be applied beyond the specifically described embodiments of the invention described herein. Moreover, in the description of the present invention, certain details have been left out to not obscure the inventive aspects of the invention. The details left out are within the knowledge of a person of ordinary skill in the art. The drawings in the present application and their accompanying detailed description are directed to merely example embodiments of the invention. To maintain brevity, other embodiments of the invention which use the principles of the present invention are not specifically described in the present application and are not specifically illustrated by the present drawings.

The present invention provides a thermal sensing and reset protection circuit for protecting an IC chip, such as an SOC, from thermal runaway. In one embodiment, the invention's thermal sensing and reset protection circuit can be fabricated in a separate IC chip that can be attached to an SOC through a semiconductor package, such as a Multi-Chip Module (MCM) package. In another embodiment, the invention's thermal sensing and reset protection circuit can be fabricated directly in the SOC. It is noted that an "IC chip" is also referred to simply as a "chip" or a "semiconductor die" in the present application.

The invention's thermal sensing and reset protection circuit can measure the SOC temperature and can generate a reset protection signal to prevent thermal runaway in the SOC when the temperature of the SOC exceeds a preset temperature. For example, the reset protection signal can be used to put the SOC in a low power mode such as a sleep mode or a reset state. For example, the reset protection signal can also be used by an on-board power management chip to control and limit power supplied to the SOC. In an embodiment of the invention, temperature sensing of the SOC can be accurately determined and a reset protection signal generated by the invention's thermal sensing and reset protection circuit can be directly applied to the SOC as well as provided to an on-board power management chip to advantageously control the power to the SOC.

Figure 1:
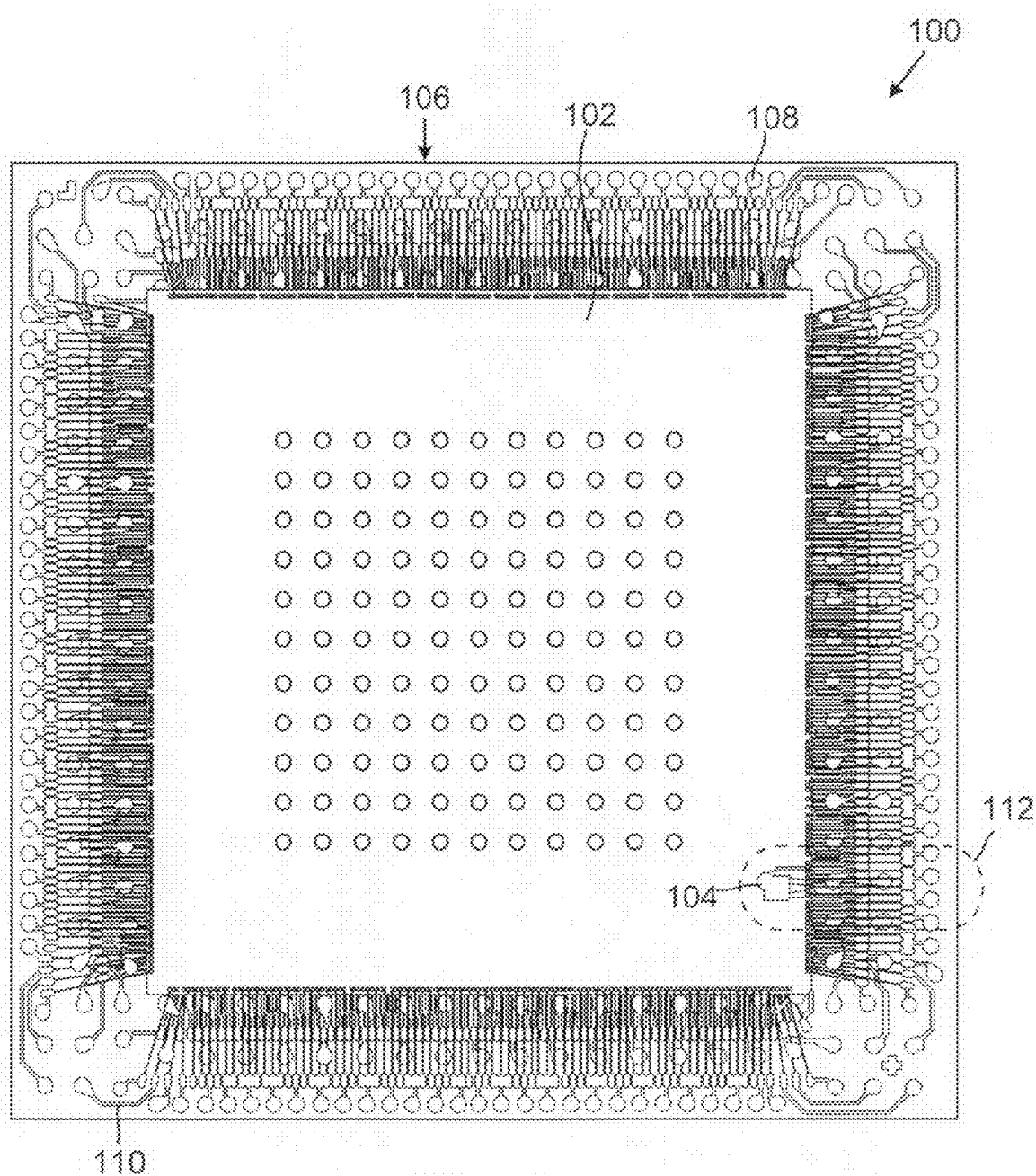
FIG. 1 shows a diagram of an exemplary semiconductor package, according to one embodiment of the present invention.

FIG. 1 shows a top view of semiconductor package 100, according to one embodiment of the present invention. In FIG. 1, semiconductor package 100, which can be a SOC package, includes SOC 102, thermal reset chip 104, and package substrate 106. As shown in FIG. 1, SOC 102 is mounted on package substrate 106 and thermal reset chip 104, which includes an embodiment of the invention's thermal sensing and reset protection circuit, is attached to the top surface of SOC 102. In one embodiment, the invention's thermal sensing and reset protection circuit can be fabricated in SOC 102. Thermal reset chip 104 can be attached to SOC 102 by, for example, utilizing an epoxy or other suitable adhesive as is known in the art. Package substrate 106 includes VSS bond pads, such as VSS bond pad 108, VDD bond pads, and I/O signal bond pads, which extend along the perimeter of the package substrate. The VSS, VDD, and I/O signal bond pads, which are situated on the top surface of package substrate 106, can be connected to appropriate bond pads situated along the perimeter of SOC 102 by respective bond wires, which are shown as straight lines extending from the outer edge of SOC 102.

Package substrate 106 also includes metal traces, such as metal trace 110, to provide interconnections on the package substrate. Interconnections between semiconductor package 100 and external devices can be provided by pins that can extend from the bottom of the semiconductor package or from leads that can extend from the edge of the semiconductor package. Semiconductor package 100 can also be encapsulated with mold compound, which is not shown in FIG. 1.

Figure 2:
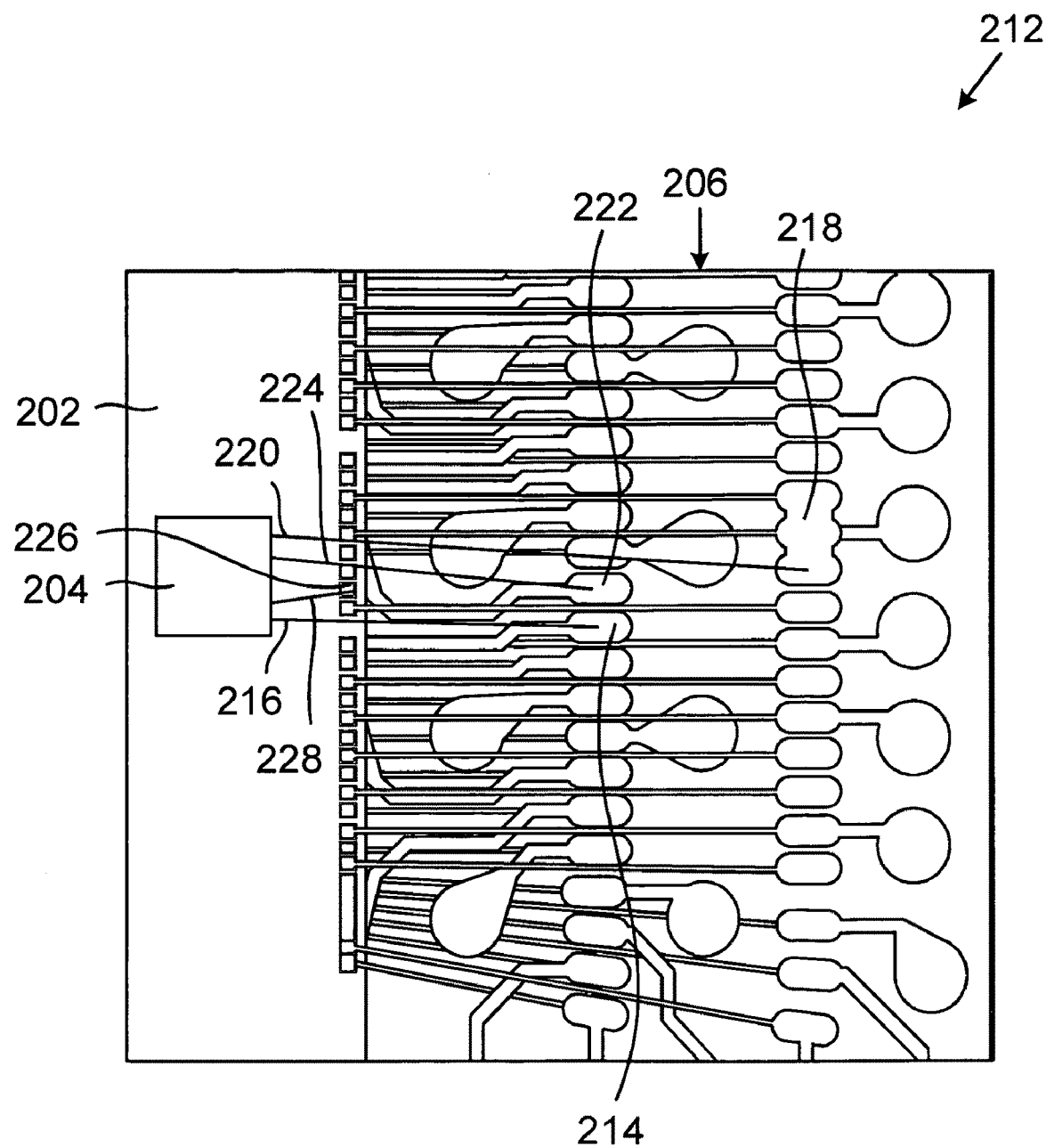
FIG. 2 shows a diagram of an expanded view of a portion of the exemplary semiconductor package of FIG. 1.

FIG. 2 shows a top view of a portion of semiconductor package 100 of FIG. 2. In FIG. 2, portion 212 corresponds to the portion of semiconductor package 100 indicated by dashed line 112 in FIG. 1. In particular, SOC 202, thermal reset chip 204, and package substrate 206 in FIG. 2 correspond, respectively, to SOC 102, thermal reset chip 104, and package substrate 106 in FIG. 1. As shown in FIG. 2, an embodiment of the invention's thermal reset chip 204 can receive VDD from VDD pad 214 on package substrate 206 via bond wire 214, VSS from VSS pad 218 on package substrate 206 via bond wire 220, and a reset input signal from reset input pad 222 on package substrate 206 via bond wire 224. VDD can be, for example, 2.5 volts or 3.3 volts. Thermal reset chip 204 can provide a reset output signal to SOC 202 via bond wire 228, which is connected between thermal reset chip 204 and bond pad 226 on the top surface of SOC 202. Thermal reset chip 204 can have ESD protection on all bond pads on the chip. Thermal reset chip 204 includes an embodiment of the invention's thermal sensing and reset protection circuit, which is discussed below in relation to FIG. 3.

Figure 3:
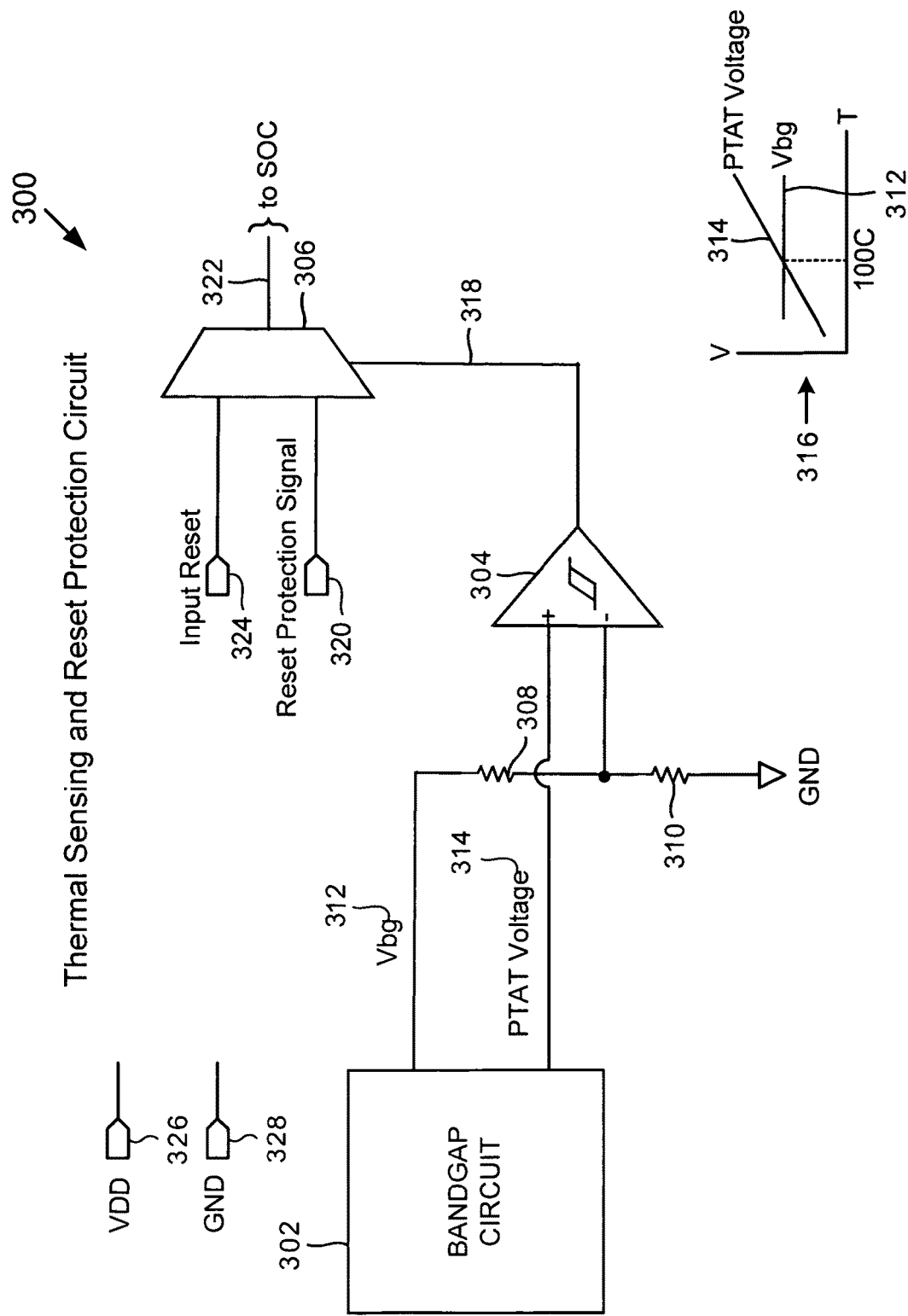
FIG. 3 shows a diagram of an exemplary thermal sensing and reset protection circuit, according to one embodiment of the present invention.

FIG. 3 shows a circuit diagram of thermal sensing and reset protection circuit 300, according to one embodiment of the present invention. Thermal sensing and reset protection circuit 300 includes bandgap circuit 302, comparator 304, multiplexer (MUX) 306, and resistors 308 and 310. In one embodiment of the invention, thermal sensing and reset protection circuit 300 can be fabricated in thermal reset chip 104 in FIG. 1. In another embodiment of the invention, thermal sensing and reset protection circuit 300 can be fabricated in SOC 102 in FIG. 1. Thermal sensing and reset protection circuit 300 can be configured to determine a temperature of an IC chip, such as SOC 102 in FIG. 1, and to provide a reset protection signal to the IC chip when the temperature of the IC chip is equal to or substantially equal to a preset temperature so as to protect the IC chip from thermal runaway.

As shown in FIG. 3, bandgap circuit 302 can generate bandgap voltage (Vbg) 312 and Proportional to Ambient Temperature (PTAT) voltage 314. Bandgap voltage 312 is a reference voltage that provides a constant or a substantially constant reference voltage across over temperature variations and Process, Voltage, and Temperature (PVT) corners and is based on an intrinsic property of the silicon in the chip. For example, bandgap voltage 312 can vary by less than 1% across PVT corners in simulation. PTAT voltage 314 is a temperature dependent voltage that can vary proportionally with respect to temperature, such as the temperature of SOC 102 in FIG. 1. PTAT voltage 314 can be generated by utilizing a transistor, such as an NPN transistor, in bandgap circuit 302 in a manner know in the art.

Also shown in FIG. 3, bandgap voltage 312 is coupled to the negative (inverting) input of comparator 304 via resistor 308, PTAT voltage 314 is coupled to the positive (non-inverting) input of comparator 304, and resistor 310 is coupled between the negative input of comparator 304 and ground. Comparator 304 can have a low offset trip and a large hysteresis. The low offset enables comparator 304 to detect a small difference between bandgap voltage 312 and PTAT voltage 314. For example, the offset of comparator 304 can be less than 2 millivolts including both systematic and random offsets. The ratio of resistor 308 and resistor 310, which form a voltage divider, can be selected to provide a desired trip point temperature for comparator 304. In one embodiment, resistors 308 and 310 can each have a resistance of approximately 1.0 kilo ohms. The trip point temperature, which is a preset temperature, can be selected to be a maximum allowable temperature for SOC 102.

As shown in graph 316 in FIG. 3, the intersection of PTAT voltage 314 and bandgap voltage 312 can determine the preset temperature, such as 100° C. When PTAT voltage 314 and bandgap voltage 312 intersect (i.e. are equal or substantially equal) at the preset temperature, such as, for example, 100° C., comparator 304 can generate a select signal on line 318, which is coupled to the select input of MUX 306. The select signal outputted by comparator 304 can be utilized to select reset protection signal 320, which can be outputted from MUX 306 on reset output 322 and coupled to a reset input bond pad on SOC 102, such as bond pad 226 in FIG. 2. Reset protection signal 320 can be utilized to put the SOC in a low power mode, such as a sleep mode or reset state, so as to prevent a thermal runaway from occurring in the SOC.

Reset protection signal 320 can continue to be applied to the SOC, such as SOC 102, until the temperature of the SOC drops below the preset hysteresis lower trip point of comparator 304 or until the power to the SOC is recycled, for example. When reset protection signal 320 is not being selected by comparator 304, MUX 306 can be configured to provide input reset 324, which can be received from a bond pad on the package substrate, to the SOC via reset output 322. Thus, for example, input reset 324 can be provided to the SOC via reset output 322 of MUX 306 prior to the temperature of the SOC increasing sufficiently so as to cause comparator 304 to trip. As further shown in FIG. 3, thermal sensing and reset protection circuit 300 can receive VDD 326 and ground 328 (e.g. VSS) from the package substrate, such as package substrate 106 in FIG. 1.

From the above description of the embodiments of the present invention, it is manifest that various techniques can be used for implementing the concepts of the present invention without departing from its scope. Moreover, while the present invention has been described with specific reference to certain embodiments, a person of ordinary skill in the art would recognize that changes can be made in form and detail without departing from the spirit and the scope of the invention. It should also be understood that the invention is not limited to the particular embodiments described herein, but is capable of many rearrangements, modifications, and substitutions without departing from the scope of the invention.

What is claimed is:

1. A semiconductor package comprising:
a first semiconductor die mounted on a package substrate; and
a second semiconductor die mounted on said first semiconductor die and including a thermal sensing and reset protection circuit;
said thermal sensing and reset protection circuit being configured to determine a temperature of said first semiconductor die and to provide a reset protection signal to said first semiconductor die when said temperature is substantially equal to a preset temperature so as to protect said first semiconductor die from thermal runaway.

2. The semiconductor package of claim 1, wherein said reset protection signal causes said first semiconductor die to be in, a sleep mode.

3. The semiconductor package of claim 1, wherein said reset protection signal causes said first semiconductor die to be in a reset state.

4. The semiconductor package of claim 1, wherein said thermal sensing and reset protection circuit comprises a bandgap circuit configured to output a reference voltage and a temperature dependent voltage, and wherein said temperature dependent voltage is proportional to said temperature of said first semiconductor die.

5. The semiconductor package of claim 4, wherein said thermal sensing and reset protection circuit further comprises a comparator configured to receive said reference voltage and said temperature dependent voltage and to cause said thermal sensing and reset protection circuit to output said reset protection signal when said temperature dependent voltage is substantially equal to said reference voltage.

6. The semiconductor package of claim 4, wherein said reference voltage is substantially independent of temperature variations.

7. The semiconductor package of claim 1, wherein said reset protection signal controls power supplied to said first semiconductor die.

8. The semiconductor package of claim 1, wherein said first semiconductor die is an SOC.

9. A semiconductor package comprising:
a semiconductor die mounted on a package substrate and including a thermal sensing and reset protection circuit;
said thermal sensing and reset protection circuit being configured to determine a temperature of said first semiconductor die and to provide a reset protection signal to said semiconductor die when said temperature is substantially equal to a preset temperature so as to protect said semiconductor die from thermal runaway.

10. The semiconductor package of claim 9, wherein said reset protection signal causes said semiconductor die to be in a sleep mode.

11. The semiconductor package of claim 9, wherein said reset protection signal causes said semiconductor die to be in a reset state.

12. The semiconductor package of claim 9, wherein said thermal sensing and reset protection circuit comprises a bandgap circuit configured to output a reference voltage and a temperature dependent voltage, and wherein said temperature dependent voltage is proportional to said temperature of said semiconductor die.

13. The semiconductor package of claim 12, wherein said thermal sensing and reset protection circuit further comprises a comparator configured to receive said reference voltage and said temperature dependent voltage and to cause said thermal sensing and reset protection circuit to output said reset protection signal when said temperature dependent voltage is substantially equal to said reference voltage.

14. The semiconductor package of claim 12, wherein said reference voltage is substantially independent of temperature variations.

15. The semiconductor package of claim 9, wherein said reset protection signal controls power supplied to said semiconductor die.

16. The semiconductor package of claim 9, wherein said semiconductor die is an SOC.

* * * * *

UNITED STATES PATENT AND TRADEMARK OFFICE
CERTIFICATE OF CORRECTION

PATENT NO.        : 8,030,719 B2
APPLICATION NO.   : 12/387892
DATED             : October 4, 2011
INVENTOR(S)       : Li et al.

Page 1 of 1

It is certified that error appears in the above-identified patent and that said Letters Patent is hereby corrected as shown below:

In the claims, column 4, line 61, "in, a" should be changed to -- in a --.

In the claims, column 5, line 24, "said first semiconductor" should be changed to -- said semiconductor --.

Signed and Sealed this
Twenty-seventh Day of March, 2012

David J. Kappos
*Director of the United States Patent and Trademark Office*